United States Patent
Tu et al.

(10) Patent No.: US 8,664,026 B2
(45) Date of Patent: Mar. 4, 2014

(54) METHOD FOR FABRICATING SEMICONDUCTOR LIGHTING CHIP

(75) Inventors: Po-Min Tu, Hsinchu (TW); Shih-Cheng Huang, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 358 days.

(21) Appl. No.: 13/211,326

(22) Filed: Aug. 17, 2011

(65) Prior Publication Data

US 2012/0142133 A1  Jun. 7, 2012

(30) Foreign Application Priority Data

Dec. 4, 2010 (CN) .......................... 2010 1 0573087

(51) Int. Cl.
*H01L 21/00* (2006.01)

(52) U.S. Cl.
USPC ................... 438/42; 438/43; 438/46; 438/47; 257/E33.064

(58) Field of Classification Search
USPC ................... 438/42, 43, 46, 47; 257/E33.064
See application file for complete search history.

(56) References Cited

U.S. PATENT DOCUMENTS

| | | | |
|---|---|---|---|
| 6,537,839 B2 * | 3/2003 | Ota et al. ........................ | 438/22 |
| 6,617,607 B2 * | 9/2003 | Ito et al. .......................... | 257/22 |
| 6,831,302 B2 * | 12/2004 | Erchak et al. .................... | 257/87 |
| 6,891,189 B2 * | 5/2005 | Ito et al. .......................... | 257/22 |
| 7,012,279 B2 * | 3/2006 | Wierer, Jr. et al. .............. | 257/94 |
| 7,125,732 B2 * | 10/2006 | Takeya et al. ................... | 438/22 |
| 7,294,866 B2 * | 11/2007 | Liu ................................ | 257/100 |
| 7,303,630 B2 * | 12/2007 | Motoki et al. ................... | 117/94 |
| 7,446,345 B2 * | 11/2008 | Emerson et al. ................ | 257/95 |
| 7,554,109 B2 * | 6/2009 | Stokes et al. .................... | 257/17 |
| 7,560,725 B2 * | 7/2009 | Koike et al. ..................... | 257/12 |
| 7,611,917 B2 * | 11/2009 | Emerson et al. ................ | 438/42 |
| 7,790,489 B2 * | 9/2010 | Shibata ........................... | 438/46 |
| 7,858,992 B2 * | 12/2010 | Ueta et al. ....................... | 257/79 |
| 8,026,117 B2 * | 9/2011 | Kim et al. ........................ | 438/45 |
| 8,129,711 B2 * | 3/2012 | Kang et al. ...................... | 257/17 |
| 8,232,568 B2 * | 7/2012 | Zhang et al. .................... | 257/94 |
| 8,440,996 B2 * | 5/2013 | Kang et al. ...................... | 257/17 |
| 8,513,039 B2 * | 8/2013 | Tu et al. .......................... | 438/41 |
| 2002/0084452 A1 * | 7/2002 | Ota et al. ......................... | 257/13 |
| 2003/0001161 A1 * | 1/2003 | Ota et al. ......................... | 257/79 |
| 2003/0141507 A1 | 7/2003 | Krames et al. | |
| 2007/0259464 A1 * | 11/2007 | Bour et al. ....................... | 438/22 |
| 2010/0135349 A1 * | 6/2010 | Schowalter et al. ..... | 372/45.012 |
| 2011/0012233 A1 * | 1/2011 | Ishibashi et al. ............... | 257/615 |
| 2011/0084310 A1 * | 4/2011 | David et al. .................... | 257/200 |

FOREIGN PATENT DOCUMENTS

| | | |
|---|---|---|
| JP | 3973799 B2 | 9/2007 |
| JP | 2007300017 A | 11/2007 |
| JP | 2008130656 A | 6/2008 |

\* cited by examiner

*Primary Examiner* — Jarrett Stark
(74) *Attorney, Agent, or Firm* — Altis Law Group, Inc.

(57) ABSTRACT

A method for fabricating a semiconductor lighting chip includes steps of providing a substrate with an epitaxial layer thereon. The epitaxial layer comprises a first semiconductor layer, an active layer and a second semiconductor layer successively grown on the substrate. The epitaxial layer has dislocation defects traversing the first semiconductor layer, the active layer and the second semiconductor layer. The epitaxial layer is then subjected to an etching process which remove parts of the second semiconductor layer and the active layer along the dislocation defects to form recesses recessing from the second semiconductor layer to the active layer. Thereafter a first electrode and a second electrode are formed on the first semiconductor layer and the second semiconductor layer, respectively.

8 Claims, 5 Drawing Sheets

METHOD FOR FABRICATING SEMICONDUCTOR LIGHTING CHIP

TECHNICAL FIELD

The disclosure generally relates to a method for fabricating a semiconductor lighting chip.

DESCRIPTION OF RELATED ART

In recent years, due to excellent light quality and high luminous efficiency, light emitting diodes (LEDs) have increasingly been used as substitutes for incandescent bulbs, compact fluorescent lamps and fluorescent tubes as light sources of illumination devices.

Due to lattice mismatch between epitaxial layers and epitaxial substrates, dislocation will appear during the growth of the epitaxial layers. The minority carriers will be captured by the dislocation and release heat in a form of nonradiative recombination, therefore reducing luminescent efficiency of the lighting chip.

Therefore, a method for fabricating a semiconductor lighting chip is desired to overcome the above described shortcomings.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

An embodiment of a method for fabricating a semiconductor lighting chip will now be described in detail below and with reference to the drawings.

Figure 1:
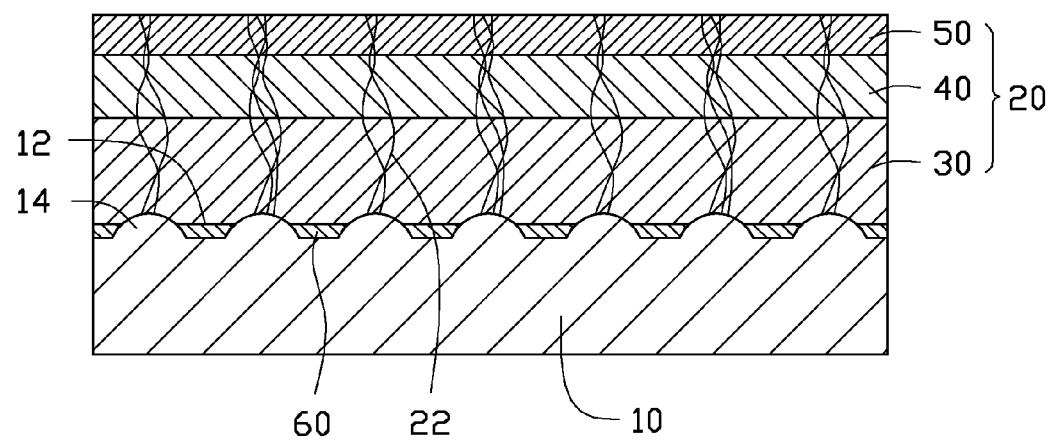
FIG. 1 is a diagram showing a first step of a method for fabricating a semiconductor lighting chip according to an embodiment of the present disclosure.

Referring to FIG. 1, a substrate 10 with an epitaxial layer 20 formed thereon is provided. Materials of the substrate 10 can be selected from a group consisting of sapphire, SiC, Si and GaN. In this embodiment, the substrate 10 is made of sapphire and a thickness of the substrate 10 ranges between 300 μm and 600 μm. In this embodiment, the thickness of the substrate 10 is 430 μm.

The substrate 10 defines a number of grooves 12 in an upper surface thereof. The grooves 12 are arranged at intervals and formed by wet etching or other method, whereby the remaining portion of the upper surface of the substrate 10 between the grooves 12 is formed with protrusions 14. The grooves 12 and the protrusions 14 are alternatively positioned along the upper surface of the substrate 10 from a lateral side to an opposite lateral side of the substrate 10. That is, each of the protrusions 14 is formed between each two neighboring grooves 12, and each of the grooves 12 is formed between each two neighboring protrusions 14. A depth of each of the grooves 12 ranges between 0.3 μm and 1.5 μm, which is determined by etching time and etching solutions. In this embodiment, the depth of each of the grooves 12 is 1 μm to achieve a desired pattern on the substrate 10.

In order to improve growth quality of the epitaxial layer 20 on the substrate 10, a buffer layer 60 is formed in the groove 12 of the substrate 10 by low-temperature growth techniques before growing the epitaxial layer 20. A thickness of the buffer layer 60 is 20 nm, which is suitable for growth of the epitaxial layers 20. The buffer layer 60 can be made of AlN or GaN and has a lattice constant matching that of the epitaxial layers 20, therefore reducing dislocation defects 22 in the epitaxial layer 20.

The epitaxial layer 20 includes a first semiconductor layer 30, an active layer 40 and a second semiconductor layer 50 subsequently formed on the substrate 10. In this embodiment, the first semiconductor layer 30 is an n-type GaN layer, the second semiconductor layer 50 is a p-type GaN layer and the active layer 40 is a multiple quantum well (MQW) layer. A thickness of the first semiconductor layer 30 is 4 μm, a thickness of the second semiconductor layer 50 is 0.1 μm and a thickness of the active layer 40 is 0.125 μm.

For further reducing the dislocation defects 22, the epitaxial layer 20 can be formed on the substrate 10 by epitaxial lateral overgrowth (ELO), FIELO (facet-initialed ELO), Pendeo-epitaxy, or facet-controlled ELO (FACELO). In this embodiment, the epitaxial layer 20 is grown by FIELO technique. The dislocation defects 22 formed in the epitaxial layer 20 will mostly gather at a region right above the protrusions 14 of the substrate 10, because the dislocation defects 22 above the grooves 12 shift from their original positions. The dislocation defects 22 traverse the first semiconductor layer 30, the active layer 40 and the second semiconductor layer 50.

Figure 2:
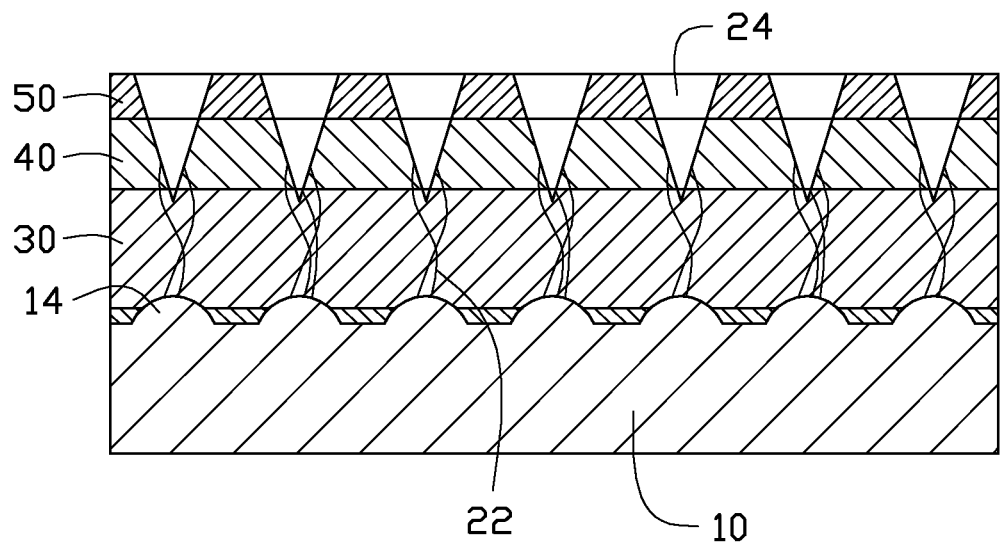
FIG. 2 is a diagram showing a second step of the method for fabricating a semiconductor lighting chip.

Referring to FIG. 2, a number of recesses 24 are formed by wet etching the upper surface of the second semiconductor layer 50. The etching solution of the wet etching can be KOH or $H_3PO_4$. Because a surface energy of the dislocation defects 22 is lower than that of other portion of the epitaxial layer 20, and the dislocation defects 22 can easily react with the etching solution, the etching will begin from the position of the dislocation defects 22 in the second semiconductor layer 50 and downwards to the first semiconductor layer 30. Due to that a surface energy of the (10-1-1) plane of the epitaxial layer 20 is the lowest, the etching solution will etch the (10-1-1) plane to form the recesses 24 with a triangle-shaped profile.

By controlling the etching time, a depth of each of the recesses 24 can be controlled in a range from 0.1 μm to 1 μm. In this embodiment, the recesses 24 extend downwards to the bottom of active layer 40 and a depth of each of the recesses 24 is about 0.225 μm. Accordingly, most of the dislocation defects 22 in the active layer 40 will be removed by etching. Recombination rate of holes and electrons will be improved and therefore increasing lighting efficiency of the semiconductor lighting chip.

Furthermore, the recesses 24 formed by etching can increase the surface area of the active layer 40 and help light emitted from the active layer 40 to travel to a surrounding environment. Besides, due to inclined sidewalls of the recesses 24, a width of each of the recesses 24 formed by the wet etching gradually decreases along a top-to-bottom direction of the epitaxial layer 20. Compared with recesses with vertical sidewalls by dry etching, light emitted from the active layer 40 will easily travel to the surrounding environment via the inclined sidewalls of the recesses 24 and light extraction efficiency of the semiconductor lighting chip is improved thereby. On the other hand, downward light emitted from the active layer 40 will be reflected back by the protrusion 14, as shown in FIG. 5.

Figure 3:
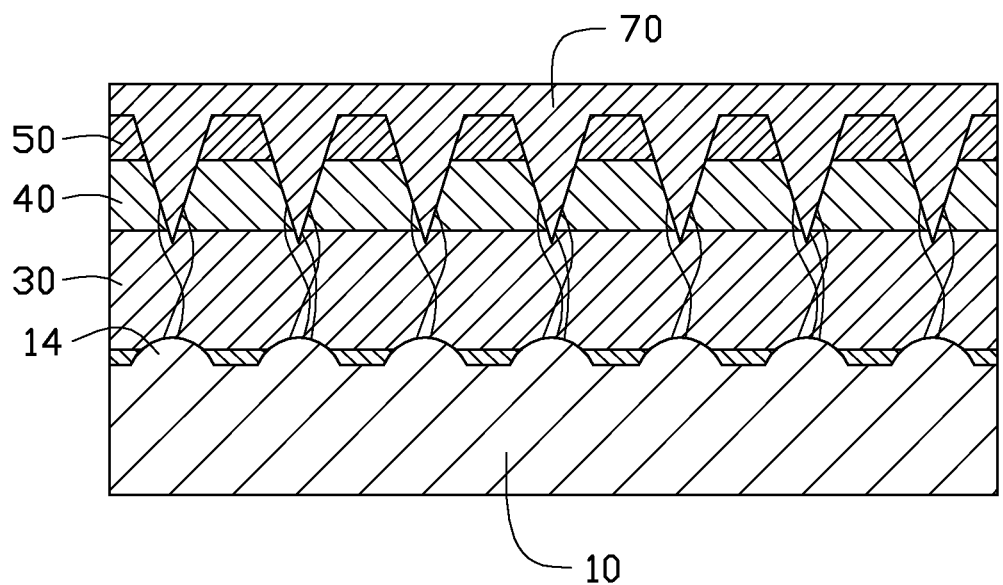
FIG. 3 is a diagram showing a third step of the method for fabricating a semiconductor lighting chip.

Referring to FIG. 3, an insulation layer 70 is formed on the epitaxial layer 20 by plasma chemical vapor deposition (PECVD), sol-gel method, E-beam gun evaporation, ion beam sputtering or physical vapor deposition. The insulation layer 70 fills the recesses 24 and covers the upper surface of the second semiconductor layer 50. The insulation layer 70 is for limiting the current path in the cone-shaped active layer 40 and the second semiconductor layer 50, and preventing conducive materials employed in later processes from entering the recesses 24. The insulation layer 70 can be made of $SiO_2$, and a thickness of the insulation layer 70 ranges between 0.1 μm and 0.2 μm.

Figure 4:
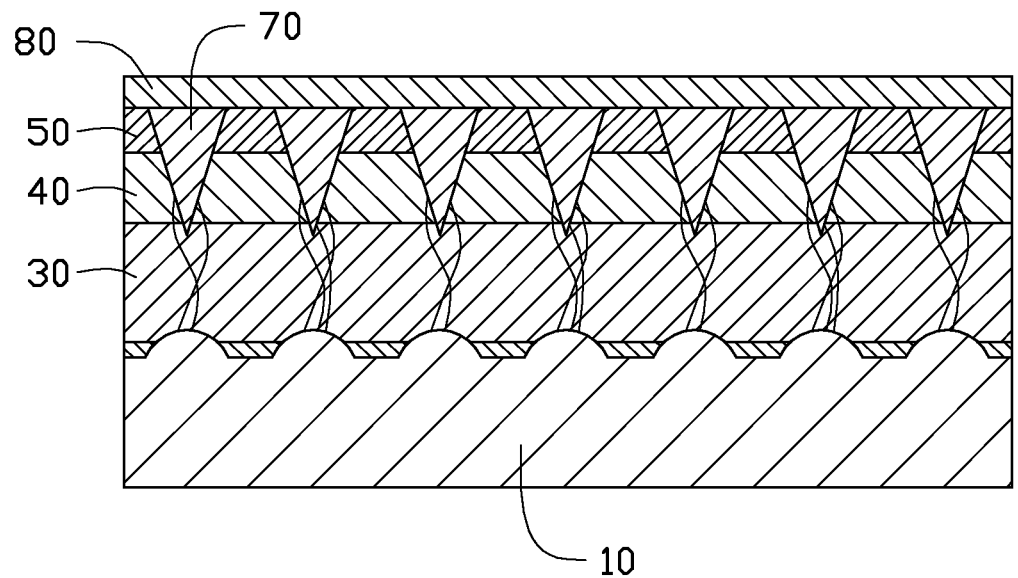
FIG. 4 is a diagram showing a fourth step of the method for fabricating a semiconductor lighting chip.

After that, referring to FIG. 4, a part of the insulation layer 70 right above the second semiconductor layer 50 is removed, and the other part of the insulation layer 70 remains in the recesses 24. The method for removing the insulation layer 70 includes but is not limited to chemical-mechanical polish (CMP), wet etching and dry etching. Thereafter, a transparent conductive layer 80 is formed on the upper surfaces of the second semiconductor layer 50 and the insulation layer 70 by vacuum evaporation, sputtering, chemical vapor deposition or E-gun evaporation. The transparent conductive layer 80 can be made of conductive materials such as indium-tin oxide (ITO) or Ni—Au alloy, therefore making current distributing uniformly on the second semiconductor layer 50. Due to the current blocking function of the insulation layer 70 remained in the recesses 24, current will flow to the first semiconductor layer 30 through the second semiconductor layer 50 and the active layer 40 sandwiched between each two adjacent recesses 24.

Figure 5:
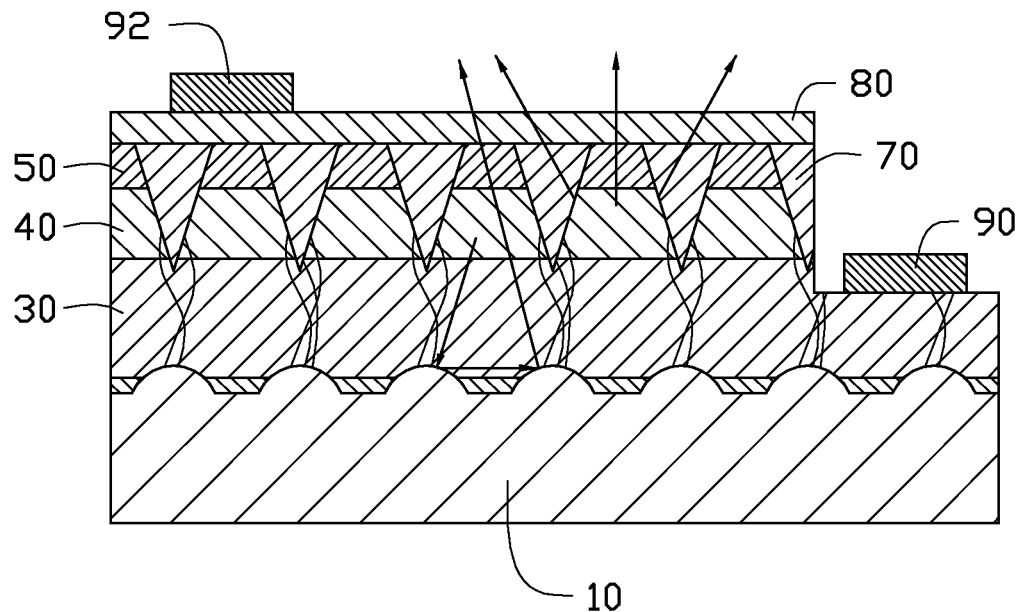
FIG. 5 is a diagram showing a fifth step of the method for fabricating a semiconductor lighting chip.

Finally, referring to FIG. 5, parts of the transparent conductive layer 80, the insulation layer 70 and the first semiconductor layer 30 are etched away by photolithography technology to expose a part of a top of the first semiconductor layer 30, which functions as an electrode supporting region. And then, a first electrode 90 is formed on the electrode supporting region by vacuum evaporation, sputtering, chemical vapor deposition or E-gun evaporation. After that, a second electrode 92 is formed on an upper surface of the transparent conductive layer 80.

The semiconductor lighting chip fabricated by the above-disclosed method has a relatively high lighting efficiency, and therefore can be widely used in high lumen solid state lamps.

The semiconductor lighting structure in the present invention relates to light-emitting diode chips and laser diode chips, which is formed by semiconductor materials and capable of emitting light.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A method for fabricating a semiconductor lighting chip, comprising:
   providing a substrate with an epitaxial layer, the epitaxial layer comprising a first semiconductor layer, an active layer and a second semiconductor layer successively grown on the substrate, the epitaxial layer having dislocation defects traversing the first semiconductor layer, the active layer and the second semiconductor layer;
   etching the epitaxial layer along the dislocation defects to form a plurality of recesses recessing downwardly from the second semiconductor layer to the active layer;
   forming an insulation layer in the recesses; and
   forming a first electrode and a second electrode on the first semiconductor layer and the second semiconductor layer, respectively.

2. The method for fabricating a semiconductor lighting chip of claim 1, further comprising forming a plurality of grooves and protrusions on an upper surface of the substrate before growing the epitaxial layer, the dislocation defects being located right above the protrusions.

3. The method for fabricating a semiconductor lighting chip of claim 2, wherein the grooves and the protrusions are arranged on the upper surface of the substrate alternatively.

4. The method for fabricating a semiconductor lighting chip of claim 2, further comprising forming a buffer layer in the grooves before growing the epitaxial layers, and a thickness of the buffer layer being less than a depth of the grooves.

5. The method for fabricating a semiconductor lighting chip of claim 1, wherein a width of each of the recesses gradually decreases from the second semiconductor layer to the active layer.

6. The method for fabricating a semiconductor lighting chip of claim 1, wherein the insulation layer fills the recesses and covers an upper surface of the second semiconductor layer.

7. The method for fabricating a semiconductor lighting chip of claim 6, further comprising forming a transparent conductive layer on the insulation layer before forming the first and second electrodes.

8. The method for fabricating a semiconductor lighting chip of claim 7, further comprising removing a portion of the insulation layer to expose the second semiconductor layer before forming the transparent conductive layer.

* * * * *